United States Patent
Lee et al.

(10) Patent No.: US 10,951,184 B2
(45) Date of Patent: Mar. 16, 2021

(54) PUSH-PULL DYNAMIC AMPLIFIER CIRCUITS

(71) Applicant: Omni Design Technologies Inc., Milpitas, CA (US)

(72) Inventors: Hae-Seung Lee, Lexington, MA (US); Denis Daly, Wellesley, MA (US)

(73) Assignee: Omni Design Technologies Inc., Milpitas, CA (US)

( * ) Notice: Subject to any disclaimer, the term of this patent is extended or adjusted under 35 U.S.C. 154(b) by 0 days.

(21) Appl. No.: 16/407,440

(22) Filed: May 9, 2019

(65) Prior Publication Data
US 2020/0358409 A1 Nov. 12, 2020

(51) Int. Cl.
*H03F 1/30* (2006.01)
*H03F 3/26* (2006.01)
*H03F 3/45* (2006.01)

(52) U.S. Cl.
CPC ......... *H03F 3/265* (2013.01); *H03F 3/45071* (2013.01)

(58) Field of Classification Search
CPC ....................................................... H03F 1/303
USPC ......................................................... 330/260
See application file for complete search history.

(56) References Cited

U.S. PATENT DOCUMENTS

| | | | | |
|---|---|---|---|---|
| 5,032,744 A | * | 7/1991 | Wai Yeung Liu | ........................... H03K 3/356026 326/124 |
| 9,473,163 B1 | * | 10/2016 | Tsai | ...................... H03M 1/466 |
| 2009/0128676 A1 | * | 5/2009 | Tanaka | ................. H04N 5/3742 348/300 |
| 2010/0213966 A1 | * | 8/2010 | Kojima | ............ G01R 31/31932 324/750.3 |
| 2015/0061730 A1 | * | 3/2015 | Tsai | ................. H03K 3/356034 327/57 |
| 2019/0088183 A1 | * | 3/2019 | Jeong | ....................... G09G 3/20 |

* cited by examiner

*Primary Examiner* — Patricia T Nguyen
(74) *Attorney, Agent, or Firm* — Intrinsic Law Corp.

(57) ABSTRACT

A push-pull dynamic amplifier is operable in reset and amplification phases. The amplifier includes first NMOS and PMOS input transistors that are electrically coupled to a first input terminal and a first output terminal. Second NMOS and PMOS input transistors are electrically coupled to a second input terminal and a second output terminal. First and second reset switches are electrically coupled to the first and second output terminals, respectively. A power supply switch is electrically coupled to the first and the second PMOS transistors, and a ground switch is electrically coupled to the first and the second NMOS transistors. During the reset phase, the reset switches are closed and the power supply switch and the ground switch are opened. During the amplification phase, the reset switches are opened and the power supply switch and the ground switch are closed.

47 Claims, 7 Drawing Sheets

PUSH-PULL DYNAMIC AMPLIFIER CIRCUITS

TECHNICAL FIELD

This application generally relates to dynamic amplifier circuits.

BACKGROUND

Dynamic amplifiers are power efficient because they do not consume static power. For this reason, they are widely employed in energy-constrained systems, particularly as a preamplifier for voltage comparators, and as inter-stage amplifiers for pipeline, analog-to-digital converters (ADCs), and pipelined successive approximation (SAR) ADCs.

FIG. 1 shows a prior art dynamic amplifier circuit 10. NMOS transistors M1 and M2 are input transistors, M3 is a ground switch, and PMOS transistors M4 and M5 are power supply switches. When the clock signal $\phi$ is low, the amplifier is reset. M4 and M5 are ON, pulling the output terminals OUT1 and OUT2 to the power supply voltage $V_{DD}$. M3 is turned off, which turns off the input transistors M1 and M2. No current flows during this time, except for a small amount of leakage current. When the clock signal $\phi$ goes high at t=0, M3 turns on, connecting the sources of M1 and M2 to ground. Assuming the input voltages $V_{I1}$ and $V_{I2}$ are greater than the threshold voltage $V_T$ of the NMOS transistors, M1 and M2 immediately begin to conduct current.

We define a common-mode input voltage $V_{IC}$ and the differential input voltage $V_{ID}$ as follows:

$$V_{IC} = \frac{V_{I1} + V_{I2}}{2} \tag{1}$$

$$V_{ID} = V_{I1} - V_{I2} \tag{2}$$

The common-mode input voltage $V_{IC}$ is thus the average of the two input voltages. The differential input voltage $V_{IC}$ is the difference between the two input voltages.

The input voltages $V_{I1}$ and $V_{I2}$ can be expressed in terms of $V_{IC}$ and $V_{ID}$:

$$V_{I1} = V_{IC} + \frac{V_{ID}}{2} \tag{3}$$

$$V_{I2} = V_{IC} - \frac{V_{ID}}{2} \tag{4}$$

Assuming both M1 and M2 are in strong inversion, their drain currents are given by:

$$I_{D1} = \frac{k'}{2}(V_{I1} - V_T)^2 = \frac{k'}{2}\left(V_{IC} + \frac{V_{ID}}{2} - V_T\right)^2 \tag{5}$$

$$I_{D2} = \frac{k'}{2}(V_{I2} - V_T)^2 = \frac{k'}{2}\left(V_{IC} - \frac{V_{ID}}{2} - V_T\right)^2 \tag{6}$$

where $$k' = \frac{1}{2}\mu_n C_{ox}\left(\frac{W}{L}\right),$$

$\mu_n$ is the mobility of electrons, $C_{OX}$ is the oxide capacitance per unit area, W is the gate width, and L is the gate length of the transistor.

At the beginning of the amplification phase, both output voltages $V_{O1}$ and $V_{O2}$ are held at $V_{DD}$ by the capacitance C1 and C2 at output terminals OUT1 and OUT2. In most cases, C1 and C2 are parasitic capacitances, and their values are matched, i.e.:

$$C1 = C2 = C \tag{7}$$

As M1 and M2 begin to conduct, their drain currents discharge the capacitances C, and the output voltages drop linearly as a function of time. The output voltages are then $$V_{O1} = V_{DD} - \frac{I_{D1}t}{2} \tag{8}$$

$$V_{O2} = V_{DD} - \frac{I_{D2}t}{2} \tag{9}$$

We define a common-mode output voltage $V_{OC}$, which is the average of the two output voltages, and a differential output voltage $V_{OD}$, which is the difference between the two output voltages:

$$V_{OC} = \frac{V_{O1} + V_{O2}}{2} \tag{10}$$

$$= V_{DD} - \frac{t}{2C}(I_{D1} + I_{D2})$$

$$= V_{DD} - \frac{t}{C} \cdot k'(V_{IC} - V_T)^2$$

$$V_{OD} = V_{O1} - V_{O2} \tag{11}$$

$$= -\frac{t}{C}(I_{D1} - I_{D2})$$

$$= -\frac{t}{C} \cdot k'(V_{IC} - V_T) \cdot V_{ID}$$

We also define the common-mode voltage drop $V_{DR}$ from $V_{DD}$:

$$V_{DR} = V_{DD} - V_{OC} = \frac{t}{C} \cdot k'(V_{IC} - V_T)^2 \tag{12}$$

The differential voltage gain $a_{vd}$ is then:

$$a_{vd} = \frac{V_{OD}}{V_{ID}} = -\frac{k'(V_{IC} - V_T)^2}{C}t = -\frac{V_{DR}}{V_{IC} - V_T} \tag{13}$$

An incremental analysis yields more insight into the gain of the dynamic amplifier.

If the differential input voltage $V_{ID}$ is small, an incremental transconductance parameter $g_m$ can be used to relate the drain current with the gate-to-source voltage:

$$I_{D1} = I + g_{m1}\frac{V_{ID}}{2} \tag{14}$$

$$I_{D2} = I - g_{m2}\frac{V_{ID}}{2}$$

We define a common-mode drain current $I_{DC}$, which is the average of the two drain currents:

$$I_{DC} = \frac{I_{D1} + I_{D2}}{2} = I \quad (15)$$

where $g_{m1}$ and $g_{m2}$ are transconductances of M1 and M2, respectively. Since M1 and M2 are matched and have nearly equal drain currents, $$g_{m1} = g_{m2} = g_m = k'(V_{IC} - V_T) \quad (16)$$

From Eqn. (14), $$V_{O1} = V_{DD} - \frac{I_{D1}t}{C} = V_{DD} - \frac{It}{C} - \frac{g_m V_{ID} t}{2c}$$

$$V_{O2} = V_{DD} - \frac{I_{D2}t}{C} = V_{DD} - \frac{It}{C} + \frac{g_m V_{ID} t}{2c} \quad (17)$$

The differential output voltage is then $$V_{OD} = V_{O1} - V_{O2} = -\frac{g_m V_{ID} t}{C} \quad (18)$$

and the common-mode output voltage is $$V_{OC} = \frac{V_{O1} + V_{O2}}{2} = V_{DD} - \frac{I_{DC} t}{C} \quad (19)$$

The corresponding differential gain is $$a_{vd} = \frac{V_{OD}}{V_{ID}} = -\frac{g_m t}{C} = \frac{k'(V_{IC} - V_T)t}{C} \quad (20)$$

which is the same result as in Eqn. (13).

The common-mode output voltage starts at $V_{DD}$ at the beginning of the amplification phase, and ramps down according to Eqn. (19). When the common-mode output voltage reaches the saturation voltage $V_{DS,SAT}$ of M1 and M2, the transistors M1 and M2 enter the triode region reducing the differential gain significantly.

As indicated in Eqn. (20), the differential voltage gain increases linearly with time, provided both M1 and M2 remain in saturation region. Once the desired gain is achieved at time, for example, $t=T_a$, the switch M3 is turned off to "freeze" the output voltages. With M3 turned off, M1 and M2 stop conducting, and the voltages at the output terminals OUT1 and OUT2 stop changing.

One key advantage of the dynamic amplifier compared with conventional amplifiers is that there is no DC standby current; thus the power consumption is significantly lower than that of conventional amplifiers. The power is consumed only to charge the capacitors C1 and C2 from $V_{DD}-V_{DR}$ at the end of the amplification phase back to $V_{DD}$. The energy consumed per amplification cycle is shown to be:

$$E = C \cdot V_{DD} \cdot V_{DR} \quad (21)$$

It can be shown from Eqns. (12) and (15) that the energy E per amplification cycle is equal to $V_{DD}$ times the total drain current $I_{D1}+I_{D2}$ for the duration $T_a$.

$$E = V_{DD} \cdot (I_{D1} + I_{D2}) T_a \quad (22)$$

Eqn. (22) indicates that the energy per amplification cycle corresponds to the amplifier conducting current for the duration $T_a$ of the amplification. Once one of the input transistors enters the triode region, the drain current decreases and the rate of the output voltage drop decreases as both output voltages decay toward ground. This causes the gain to decrease. Therefore, the maximum gain is achieved with maximum $V_{DR}$ before the input transistors reach the triode region, which is given by:

$$V_{DR,MAX} = V_{DD} - V_{DS,SAT} = V_{DD} - (V_{IC} - V_T) \quad (23)$$

The maximum voltage gain is then $$a_{vd,max} = \frac{V_{DR,MAX}}{V_{IC} - V_T} = \frac{V_{DD}}{V_{IC} - V_T} - 1 \quad (24)$$

FIG. 2 is a graphical representation 20 of the differential voltage gain as a function of time t for dynamic amplifier circuit 10. It increases linearly with time until the gain reaches a maximum at $T_{opt}$, past which point gain begins to decrease sharply, because the input transistors M1 and M2 enter the triode region.

Typically, $V_{IC}-V_T$ is a few hundred millivolts in strong inversion, and in nanoscale CMOS technology, $V_{DD}$ is only on the order of 1V. Thus, the maximum possible gain of the prior art dynamic amplifier is severely limited. As illustrated in FIG. 2, the window of time during which the amplifier provides the gain greater than the minimum desired gain of $a_{vd,min}$ is between $T_1$ and $T_2$. This time period is short, especially in high-speed amplifiers. In order to "freeze" the output voltage in the region, the switch M3 must be turned off between $T_1$ and $T_2$. Thus, the timing between turning M3 on and then off is critical in obtaining the desired gain.

Noise in the amplifiers is the dominant factor in determining the signal-to-noise ratio of the system. The drain currents of M1 and M2 contain thermal noise, and the output voltages exhibit random-walk noise during the amplification phase.

The thermal noise spectral density of a MOS transistor biased in strong inversion saturation region is given by:

$$S(f) = \frac{8kT}{3g_m} \quad (25)$$

where $g_m$ is the transconductance of the transistor, k is Boltzman's constant, and T is the absolute temperature.

Noise bandwidth can be derived from Parseval's theorem:

$$NBW = \frac{1}{2T_a} \quad (26)$$

The input-referred noise from the two input transistors M1 and M2 is then $$\overline{v_n^2} = 2S(f) \cdot NBW = \frac{8kT}{3T_a g_m} \quad (27)$$

When the reset switches at the drain of M1 and M2 are turned off, thermal noise in these switches is sampled on C giving output-referred-mean-square noise on each side of the output:

$$\overline{v_o^2} = \frac{kT}{C} \quad (28)$$

The noise in Eqn. (28) is often referred to as reset noise. The differential-output-referred-mean-square noise is then twice that in Equation (28);

$$\overline{v_{or}^2} = \frac{2kT}{C} \quad (29)$$

Referring the output noise to the differential input, the noise in Equation (29) is divided by the square of the differential gain $a_{vd}$ $$\overline{v_{ir}^2} = \frac{2kT}{C} \cdot \frac{1}{a_{vd}^2} \quad (30)$$

where the differential gain $a_{vd}$ is given by Eqn. (20). In typical circuits, the input referred thermal noise in Eqn. (27) dominates, and the input-referred-reset noise in Eqn. (30) can be ignored. It can be seen from Eqn. (27) that given the amplification time $T_a$, the device transconductance must be high for low-input-referred noise.

It would be desirable to overcome one or more deficiencies in the prior art. For example, it would be desirable to provide a dynamic amplifier that does not require the high timing precision (e.g., in turning on and off M3) to obtain a desired gain.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a dynamic amplifier operable in a reset phase and an amplification phase, comprising: a first and a second input terminal; a first and a second output terminal; a first NMOS input transistor electrically coupled to the first input terminal and the first output terminal; a second NMOS input transistor electrically coupled to the second input terminal and the second output terminal; a first PMOS input transistor electrically coupled to the first input terminal and the first output terminal; a second PMOS input transistor electrically coupled to the second input terminal and the second output terminal; a first reset switch electrically coupled to the first output terminal; a second reset switch electrically coupled to the second output terminal; a power supply switch electrically coupled to the first and the second PMOS transistors; and a ground switch electrically coupled to the first and the second NMOS transistors. During the reset phase, the first and the second reset switches are closed, and the power supply switch and the ground switch are opened. During the amplification phase, the first and the second reset switches are opened, and the power supply switch and the ground switch are closed.

In one or more embodiments, a first input voltage is electrically coupled to the first input terminal, and a second input voltage is electrically coupled to the second input terminal. In one or more embodiments, the power supply switch comprises a PMOS transistor, and the ground switch comprises an NMOS transistor. In one or more embodiments, an average current of the first and the second PMOS transistors is substantially equal to an average current of the first and the second NMOS transistors. In one or more embodiments, sizes of the first and the second PMOS input transistors are configured such that an average current of the first and the second PMOS transistors is substantially equal to an average current of the first and the second NMOS transistors. In one or more embodiments, the first and the second reset switches are electrically coupled to a reset voltage.

In one or more embodiments, the power supply switch and the ground switch are turned off at the end of the amplification phase. In one or more embodiments, the amplifier further comprises a first sampling capacitor; and a first input switch electrically coupled to the first sampling capacitor and a first input voltage. In one or more embodiments, the amplifier further comprises a first sampling switch electrically coupled to the first input terminal. In one or more embodiments, the amplifier further comprises a first reference switch electrically coupled to the first sampling capacitor. In one or more embodiments, the first input switch is closed during the reset phase and opened during the amplification phase. In one or more embodiments, the first reference switch is opened during the reset phase and closed during the amplification phase. In one or more embodiments, the first reference switch is electrically coupled to a first reference voltage.

In one or more embodiments, the amplifier further comprises a second sampling capacitor; and a second input switch electrically coupled to the second sampling capacitor and a second input voltage. In one or more embodiments, the amplifier further comprises a first sampling switch electrically coupled to the first input terminal; and a second sampling switch electrically coupled to the second input terminal. In one or more embodiments, the amplifier further comprises a first reference switch electrically coupled to the first sampling capacitor; and a second reference switch electrically coupled to the second sampling capacitor. In one or more embodiments, the first and the second input switches are closed during the reset phase and opened during the amplification phase. In one or more embodiments, the first and the second reference switches are opened during the reset phase and closed during the amplification phase. In one or more embodiments, the first reference switch is electrically coupled to a first reference voltage, and the second reference switch is electrically coupled to a second reference voltage.

In one or more embodiments, the first reset switch is electrically coupled to the first input terminal, and the second reset switch is electrically coupled to the second input terminal.

Another aspect of the invention is directed to a dynamic amplifier operable in a reset phase and an amplification phase, comprising: a first, a second, a third, and a fourth input terminal; a first and a second output terminal; a first NMOS input transistor electrically coupled to the first input terminal and the first output terminal; a second NMOS input transistor electrically coupled to the second input terminal and the second output terminal; a first PMOS input transistor electrically coupled to the third input terminal and the first output terminal; a second PMOS input transistor electrically coupled to the fourth input terminal and the second output terminal; a first reset switch electrically coupled to the first output terminal; a second reset switch electrically coupled to the second output terminal; a power supply switch electrically coupled to the first and the second PMOS transistors; and a ground switch electrically coupled to the first and the second NMOS transistors. During the reset phase, the first and the second reset switches are closed, and the power supply switch and the ground switch are opened. During the amplification phase, the first and the second reset switches are opened, and the power supply switch and the ground switch are closed.

In one or more embodiments, the amplifier further comprises a first sampling capacitor electrically coupled to the first input terminal; a second sampling capacitor electrically coupled to the second input terminal; a first input switch electrically coupled to the first sampling capacitor and a first input voltage; and a second input switch electrically coupled to the second sampling capacitor and a second input voltage.

In one or more embodiments, the amplifier further comprises a third sampling capacitor electrically coupled to the third input terminal; a fourth sampling capacitor electrically coupled to the fourth input terminal; a third input switch electrically coupled to the third sampling capacitor and the first input voltage; and a fourth input switch electrically coupled to the fourth sampling capacitor and the second input voltage.

In one or more embodiments, the first reset switch is electrically coupled to the third input terminal, and a second reset switch is electrically coupled to the fourth input terminal. In one or more embodiments, the first reset switch is electrically coupled to the first input terminal, and the second reset switch is electrically coupled to the second input terminal.

BRIEF DESCRIPTION OF THE DRAWINGS

For a fuller understanding of the nature and advantages of the present concepts, reference is made to the following detailed description of preferred embodiments and in connection with the accompanying drawings. In the drawings, like reference characters generally refer to like features (e.g., functionally-similar and/or structurally-similar elements).

DETAILED DESCRIPTION

Following below are more detailed descriptions of various concepts related to, and embodiments of, inventive apparatus relating to dynamic amplifier circuits. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 2:
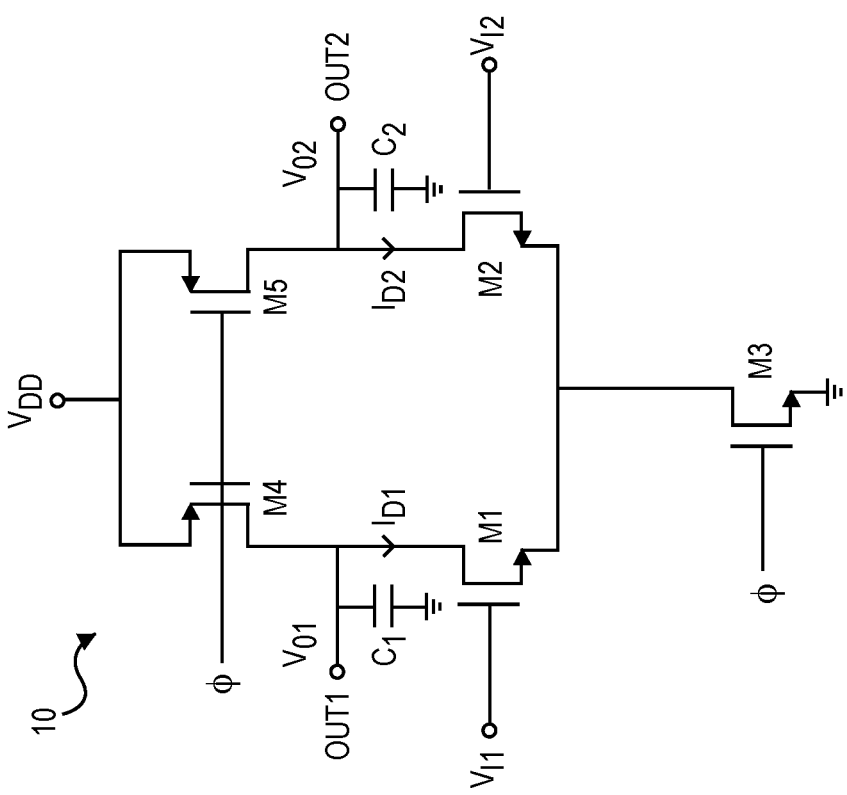
FIG. 2 is a graphical representation of the differential voltage gain as a function of time for the dynamic amplifier circuit illustrated in FIG. 1.

As is evident from FIG. 2, prior art dynamic amplifiers require precise timing to achieve enough gain. Even with optimum timing that is difficult to achieve, the maximum gain is limited according to Eqn. (24). Embodiments of the invention overcome one or more of these and/or other deficiencies in the art.

Figure 3:
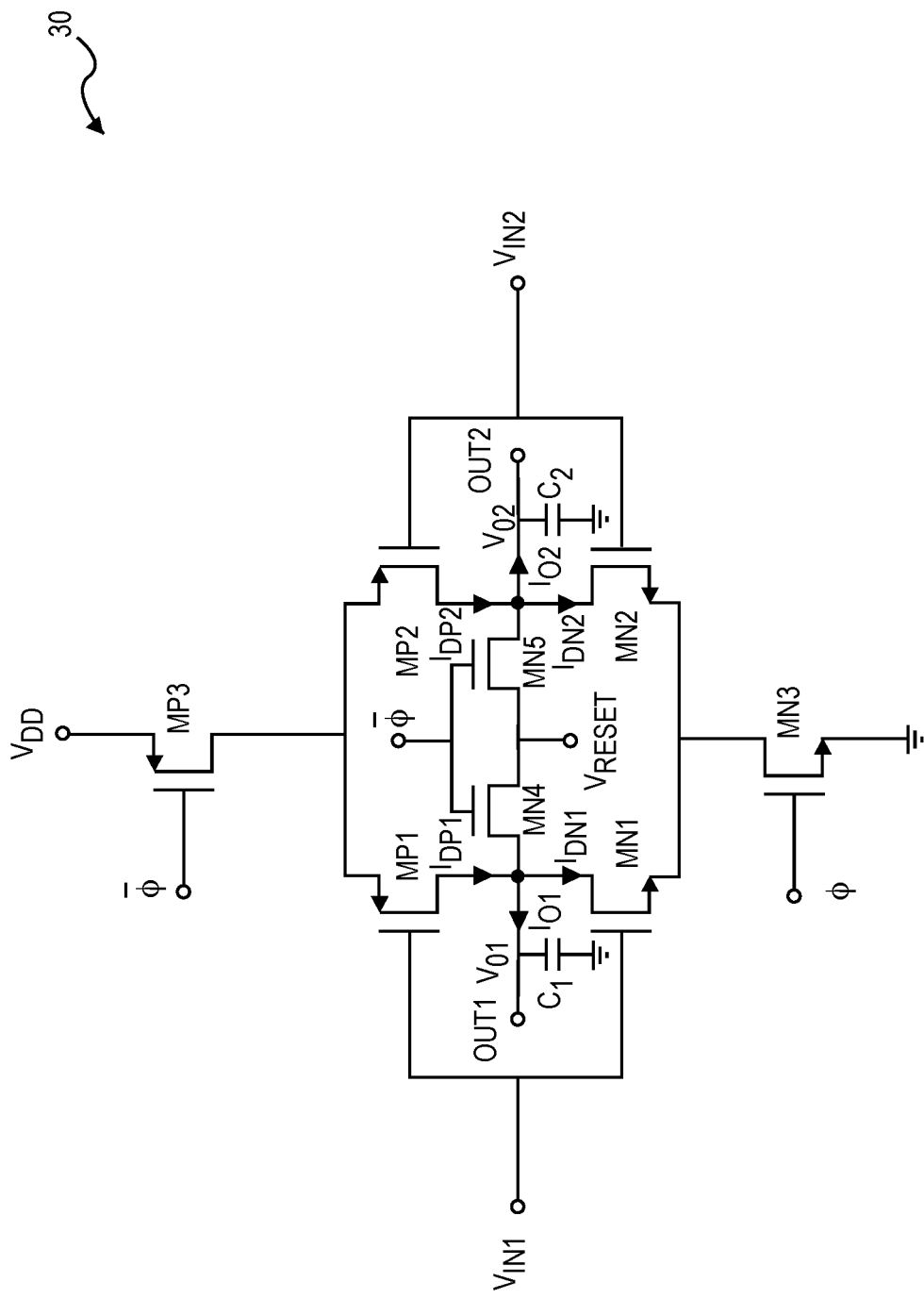
FIG. 3 is a schematic diagram of a push-pull dynamic amplifier circuit according to a first embodiment of the invention.

The inventors have recognized that it is advantageous to utilize a push-pull input structure in a dynamic amplifier. The first embodiment according to the present invention is shown in FIG. 3. The push-pull dynamic amplifier 30 comprises NMOS input transistors MN1 and MN2, an NMOS ground switch MN3, reset switches MN4 and MN5, PMOS input transistors MP1 and MP2, and a power supply switch MP3. The sizes of MN1, MN2, MN3, MP1, MP2, and MP3 are chosen appropriately such that when the input voltages $V_{I1}$ and $V_{I2}$ are at a nominal input common-mode voltage $V_{IC}$ and MN3 and MP3 are turned on, the drain currents of MN1, MN2, MN3, and MN4 are substantially equal (e.g., within about 3% of each other, within about 2% of each other, within about 1% of each other, within about 0.5% of each other, or within a percentage between any two of the foregoing percentages of each other). As used herein, "about" means plus or minus up to 10% of the relevant value.

During the reset phase when the clock phase ϕ is low, the ground switch MN3 and the power supply switch MP3 are turned off, and the reset transistors MN4 and MN5 are turned ON such that the output terminals OUT1 and OUT2 are shorted to the reset voltage $V_{RESET}$. The reset voltage $V_{RESET}$ can be, for example, the system common-mode voltage $V_{CM}$ or $V_{DD}/2$.

At the beginning of the amplification phase when the clock phase ϕ is high, switches MN3 and MP3 are turned on, and the switches MN4 and MN5 are turned off. Assuming MN1 and MN2 are perfectly matched, and MP1 and MP2 are also perfectly matched, and the input voltages $V_{I1}$ and $V_{I2}$ are at the nominal input common-mode voltage $V_{IC}$, then the drain currents of MN1, MN2, MP3, and MP2 are, respectively:

$$I_{DN1} = I_{DN2} = I_{DP1} = I_{DP2} = I \quad (31)$$
where $$I = \frac{k'_n}{2}(V_{IC} - V_{Tn})^2 = \frac{k'_p}{2}(V_{DD} - V_{IC} - |V_{Tp}|)^2 \quad (32)$$

where $$k'_n = \mu_n C_{OX} \left(\frac{W}{L}\right)_{n1}, k'_p = \mu_n C_{OX} \left(\frac{W}{L}\right)_{p1},$$

$\mu_p$ is the mobility of holes, $V_{Tn}$ is the threshold voltage of NMOS, $V_{Tp}$ is the threshold voltage of PMOS, $$\left(\frac{W}{L}\right)_{n1}$$

is the ratio between W and L of MN1, and $$\left(\frac{W}{L}\right)_{p1}$$

is the ratio between W and L of MP1.

In this case, no current flows into or out of capacitors C1 and C2:

$$I_{O1} = I_{DP1} - I_{DP1} = 0$$

$$I_{O2} = I_{DP2} - I_{DN2} = 0 \quad (33)$$

Thus, both output voltages $V_{OUT1}$ and $V_{OUT2}$ remains at $V_{CM}$ and the differential output voltage is zero. If $V_{I1}$ and $V_{I2}$ differ, then:

$$V_{I1} = V_{IC} + \frac{V_{ID}}{2}$$

$$V_{I2} = V_{IC} - \frac{V_{ID}}{2} \quad (34)$$

Assuming the differential input voltage $V_{ID}$ is small, the drain current $I_{DN1}$, $I_{DN2}$, $I_{DP1}$, and $I_{DP2}$ are $$I_{DN1} = I + g_{mn1}\left(\frac{V_{ID}}{2}\right)$$

$$I_{DN2} = I - g_{mn2}\left(\frac{V_{ID}}{2}\right) \quad (35)$$

$$I_{DP1} = I - g_{mp1}\left(\frac{V_{ID}}{2}\right)$$

$$I_{DP2} = I + g_{mp2}\left(\frac{V_{ID}}{2}\right) \quad (36)$$

where $g_{mn1}$, $g_{mn2}$, $g_{mp1}$, and $g_{mp2}$ are the transconductances of MN1, MN2, MP1, and MP2, respectively.

The NMOS common-mode drain current, i.e. the average of the NMOS drain currents is $$I_{DNC} = \frac{I_{DN1} + I_{DN2}}{2} = I \quad (37)$$

Also, the PMOS common-mode drain current, i.e. the average of the PMOS drain currents is $$I_{DPC} = \frac{I_{DP1} + I_{DP2}}{2} = I \quad (38)$$

For simplicity, we assume that the output resistances of MN1, MN2, MP1, and MP2, are infinite when they are in saturation region. In that case, the output current $I_{O1}$, which is the difference between the drain currents of MN1 and MP1, flows into C1. Also, the output current $I_{O2}$, which is the difference between the drain currents of MN2 and MP2, flows into C2. This can be expressed as follows:

$$I_{O1} = I_{DP1} - I_{DN1} = -(g_{mn1} + g_{mp1})\frac{V_{ID}}{2}$$

$$I_{O2} = I_{DP2} - I_{DN2} = (g_{mn2} + g_{mp2})\frac{V_{ID}}{2} \quad (39)$$

The common-mode output current $I_{OC}$, which is the average of the output currents $I_{O1}$ and $I_{O2}$, is $$I_{OC} = \frac{I_{O1} + I_{O2}}{2} = \frac{(I_{DP1} - I_{DN1}) + (I_{DP2} - I_{DN2})}{2} = \quad (40)$$

$$\frac{I_{DP1} + I_{DP2}}{2} - \frac{I_{DN1} + I_{DN2}}{2} = I_{DPC} - I_{DNC}$$

The output voltages are then $$V_{O1} = V_{CM} - \frac{I_{O1}}{C_1}t = V_{CM} - (g_{mn1} + g_{mp1})\frac{V_{ID}}{2C}t$$

$$V_{O2} = V_{CM} + \frac{I_{O2}}{C_2}t = V_{CM} + (g_{mn2} + g_{mp2})\frac{V_{ID}}{2C}t \quad (41)$$

Noting that when $g_{mn1} = g_{mn2}$ and $g_{mp1} = g_{mp2}$, the differential output voltage is $$V_{OD} = V_{O1} - V_{O2} = -(g_{mn1} + g_{mp1})\frac{V_{ID}}{C}t \quad (42)$$

The differential voltage gain $a_{vd}$ is obtained from Eqn. (42)

$$a_{vd} = \frac{V_{OD}}{V_{ID}} = -\frac{g_{mn1} + g_{mp1}}{C}t \quad (43)$$

Figure 1:
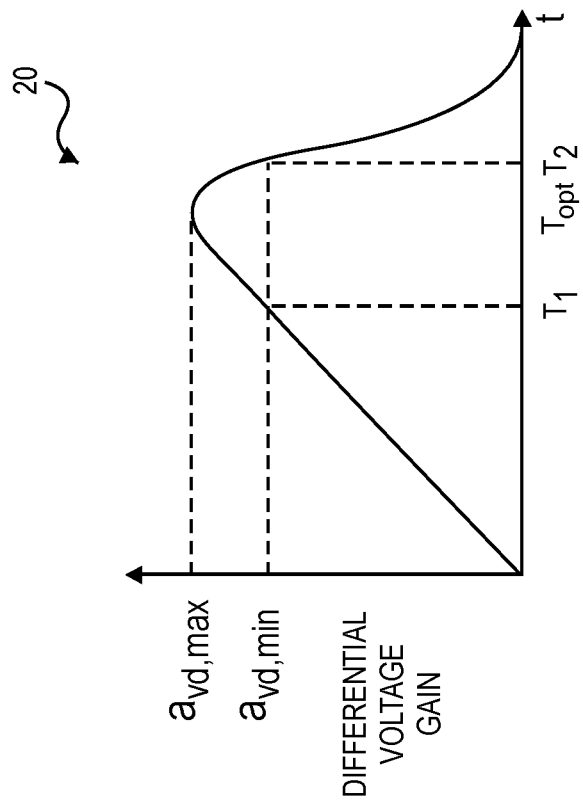
FIG. 1 is a schematic diagram of a dynamic amplifier circuit according to the prior art.

As with the prior art dynamic amplifier circuit in FIG. 1, the differential gain of the dynamic amplifier according to aspects of the present invention is proportional to time. However, the gain develops faster with time because the transconductances of the NMOS and the PMOS transistors add up.

The common-mode output voltage is given by $$V_{OC} = \frac{V_{O1} + V_{O2}}{2} = V_{CM} - \frac{I_{OC}t}{C} \qquad (44)$$

Since $I_{OC}$ is zero from Eqn. (40), the common-mode output voltage $V_{OC}$ stays at $V_{CM}$. This is in contrast to the prior art dynamic amplifier in FIG. 1 in which the common-mode output voltage drops with time and eventually causes input transistors M1 and M2 to enter the triode region. This effect gave only a brief window of time during which optimum gain is achieved, as shown in FIG. 2. However, in the embodiment illustrated in FIG. 3, the common-mode output voltage stays at $V_{CM}$, because only the differential drain currents flow into C1 and C2.

When the differential output voltage $V_{OD}$ becomes too large, one or more transistors may enter the triode region. For example, if $V_{ID}>0$, the output $V_{O1}$ ramps down and the output $V_{O2}$ ramps up according to Eqn. (31). If $V_{O1}$ falls below $V_{DS,SATn1}$ of MN1, MN1 enters the triode region. Also, if $V_{O2}$ rises above $V_{DD}-|V_{DS,SATp2}|$, MP2 enters the triode region. For simplicity, let's assume that MN1 and MP2 enter the triode region at the same time. Then, the currents $I_{DN1}$ of MN1 and $I_{DP2}$ of MP2, respectively, begin to decrease significantly, reducing the respective currents flowing into C1 and C2, slowing the increase of differential output voltage versus time. Eventually, when $I_{DN1}$ decreases enough to match $I_{DP1}$, the output current $I_{O1}$ drops to zero, and $V_{O1}$ stops decreasing. Likewise, when $I_{DP2}$ decreases enough to match $I_{DN2}$, the output current $I_{O2}$ drops to zero, and $V_{O1}$ stops increasing. This prevents the differential gain from increasing further, instead making it saturate.

Figure 4:
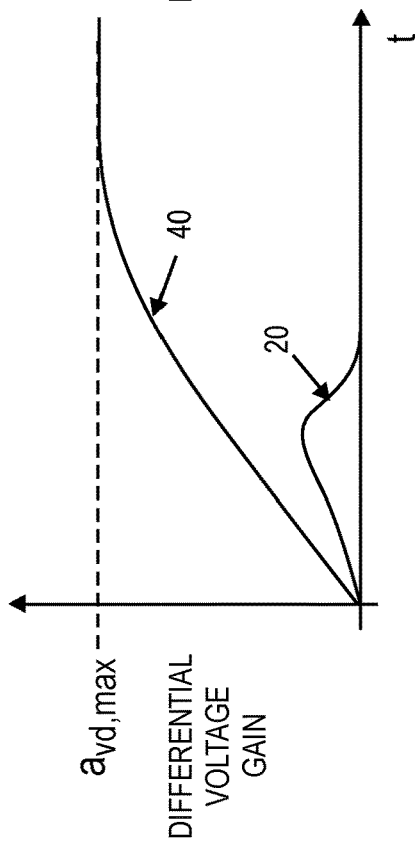
FIG. 4 is a graphical representation of the differential voltage gain as a function of time for the push-pull dynamic amplifier illustrated in FIG. 3.

FIG. 4 is a graphical representation 40 of the differential voltage gain as a function of time of the push-pull dynamic amplifier 30 illustrated in FIG. 3. The differential gain increases with time as indicated in Eqn. (43). However, in contrast to the differential gain 20 of the prior art dynamic amplifier 10 that quickly goes down shortly past the peak, the differential gain 40 of the amplifier 30 in FIG. 3 monotonically increases until it saturates. Therefore, the timing to freeze the output voltage by turning off the ground switch MN3 and the power supply switch MP3 is not critical. This is an advantage over the prior art dynamic amplifier 10.

Also, comparing Eqns. (20) and (43), the gain of the push-pull dynamic amplifier 30 increases faster in time compared with the prior art dynamic amplifier 10, making it more suitable for high-speed amplification. In addition, the maximum-available gain of the push-pull dynamic amplifier 30 is much higher than that of the prior art dynamic amplifier 10. There are two reasons for this. First, the gain of the push-pull dynamic amplifier 30 is not limited by the common-mode drop $V_{DR,MAX}$ in Eqn. (23), because the common-mode output voltage is fixed at $V_{CM}$. Second, both the NMOS and PMOS input transistors in the push-pull dynamic amplifier 30 convert the differential input voltage to the differential output currents as indicated in Eqn. (30) making the differential output current larger compared with the prior art dynamic amplifier 10.

It can be shown that the push-pull dynamic amplifier 30 in accordance with the present invention has lower input-referred-noise-spectral density compared to that of the prior art dynamic amplifier 10 in FIG. 1.

$$S_i(f) = \frac{16kT}{3(g_{mn1} + g_{mp1})} \qquad (45)$$

The input referred mean-square noise is given by:

$$\overline{v_n^2} = S_i(f) \cdot NBW = \frac{8kT}{3T_a(g_{mn1} + g_{mp1})} \qquad (46)$$

where $T_a$ is the duration of amplification, defined as the duration for which the ground switch MN3 and the power supply switch MP3 are on. Compared to Eqn. (27) for the prior art amplifier 10, the input-referred noise is lower because the transconductances of NMOS and PMOS transistors add up.

In addition, since the gain of the push-pull dynamic amplifier 30 is larger than that of the prior art amplifier 10, the input-referred-reset noise is even more negligible.

One possible drawback of the first embodiment of the invention in FIG. 3 is the sensitivity to the power-supply voltage $V_{DD}$. Nominally, the input common-mode voltage $V_{IC}$ is set such that the common-mode drain current of NMOS transistors MN1 and MN2 match that of the PMOS transistors MP1 and MP2. Ignoring the small voltage drop across the ground switch MN3 and the power supply switch MP3, the common-mode voltage $V_{IC}$ is set to satisfy Eqn. (32) at a particular $V_{DD}$. If $V_{DD}$ changes, however, the PMOS current changes. For example, if $V_{DD}$ is increased by $\Delta V$, and assuming zero differential input voltage, the PMOS current increases to $$I_{DP1} = I_{DP2} = \qquad (47)$$
$$\frac{k_p'}{2}(V_{DD} + \Delta V - V_{IC} - |V_{Tp}|)^2 = I + k_p' \Delta V (V_{DD} - V_{IC} - |V_{Tp}|)$$

Since the currents through the NMOS transistors are not a function of $V_{DD}$:

$$I_{DN1} = I_{DN2} = \frac{k_n'}{2}(V_C - V_{Tn})^2 \qquad (48)$$

Therefore, the common-mode output current $I_{OC}$ is:

$$I_{OC} = I_{DPC} - I_{DNC} = k_p' \Delta V (V_{DD} - V_{IC} - |V_{Tp}|) \qquad (49)$$

Which causes the common-mode output voltage to ramp up:

$$V_{OC} = \frac{I_{OC}t}{C} = \frac{k_p' \Delta V (V_{DD} - V_{IC} - |V_{Tp}|)}{C} t \qquad (50)$$

Figure 5:
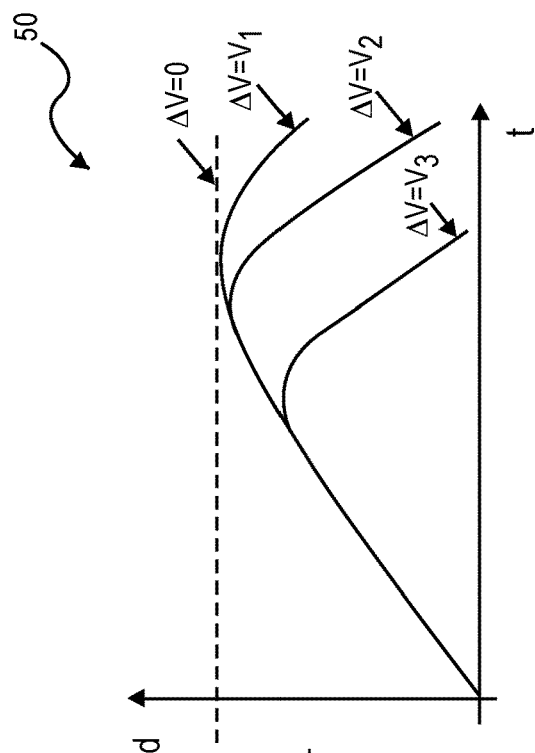
FIG. 5 is a graphical representation of the differential voltage gain as a function of time for different power supply voltages in the push-pull dynamic amplifier illustrated in FIG. 3.

When differential input is applied, the common-mode output voltage ramps up in the same manner as given by Eqn. (50), and eventually causes both PMOS transistors MP1 and MP2 to enter the triode region, at which point the differential gain is significantly reduced. Therefore, instead of the differential gain saturating, it begins to get lower, showing a gain peak as shown in FIG. 5. Although the gain peak is significantly higher than that of the prior art dynamic amplifier, this is still undesirable.

On the other hand, if $V_{DD}$ is reduced (negative $\Delta V$), the common-mode output voltage ramps down at the same rate. In this case, both NMOS transistors MN1 and MN2 eventually enter the triode region, at which point the differential gain is also significantly reduced. Therefore, instead of the differential gain saturating, it begins to get lower, again showing a gain peak as shown in FIG. 5.

As indicated in Eqn. (50), the common-mode ramp rate is proportional to $\Delta V$. Therefore, when $\Delta V$ is smaller it will take a longer time for MP1 and MP2 (or MN1 and MN2) to reach the triode region. Simulated plots 50 of the gain versus time for various $\Delta V$ are shown in FIG. 5 where $$|V_3|>|V_2|>|V_1| \qquad (51)$$

Figure 6:
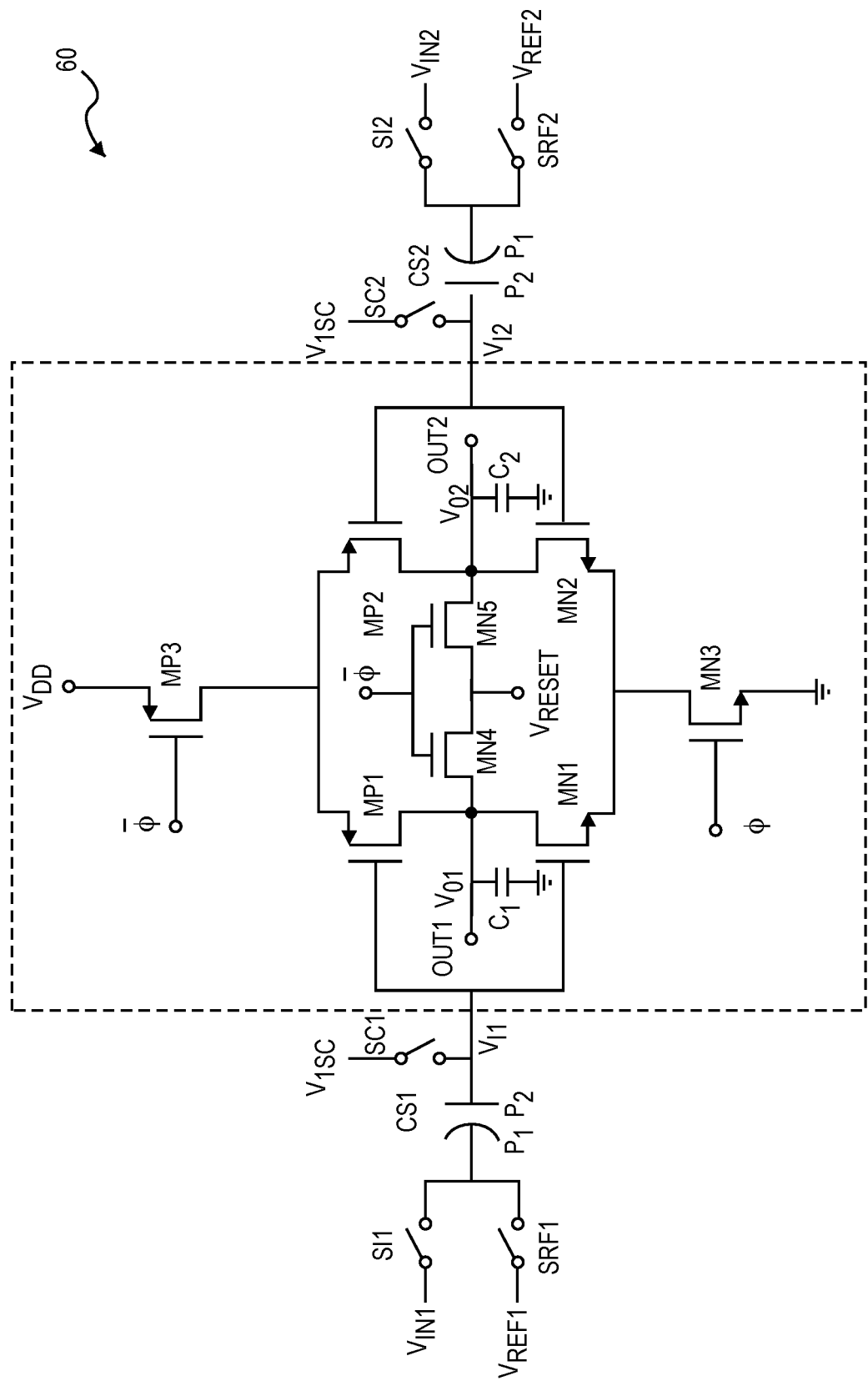
FIG. 6 is a schematic diagram of a push-pull dynamic amplifier circuit according to a second embodiment of the invention.

FIG. 6 shows a second embodiment of the present invention that significantly reduces the power-supply sensitivity. This embodiment comprises a push-pull dynamic amplifier 60, and further includes input sampling capacitors CS1 and CS2, each with two plates P1 and P2, common-mode sampling switches SC1 and SC2, input switches SI1 and S12, and reference switches SRF1 and SRF2. It further includes input sampling common-mode voltage $V_{ISC}$. The amplifier circuit 60 operates in two phases: a reset phase and an amplification phase.

During the reset phase, switches SC1, SC2, SI1, and S12 are closed. The ground and the power supply switches MN3 and MP3 are opened, and the reset switches MN4 and MN5 are closed. This affects the input voltage $V_{IN1}$ to be applied to the plate P1 of the capacitor CS1, and $V_{IN2}$ to be applied to the plate P1 of the capacitor CS2. The sampling common-mode voltage $V_{ISC}$ is applied to the plate P2 of both CS1 and CS2. At the end of the reset phase, the common-mode sampling switches SC1 and SC2 are opened, and then the input switches SI1 and S12 are opened. This locks the voltages across CS1 and CS2 as follows:

$$V_{CS1}=V_{ISC}-V_{IN1}$$

$$V_{CS2}=V_{ISC}-V_{IN2} \qquad (52)$$

Where $V_{CS1}$ and $V_{CS2}$ are the sampled voltages across CS1 and CS2, respectively.

At the beginning of the amplification phase, the reference switches SRF1 and SRF2 are closed, applying the reference voltages $V_{REF1}$ and $V_{REF2}$ to the plate P1 of CS1 and CS2, respectively. Also, the power-supply switches MN3 and MP3 are closed. This causes the input voltages $V_{I1}$ and $V_{I2}$ of the amplifier 60 to change to:

$$V_{I1}=V_{ISC}-(V_{IN1}-V_{REF1})$$

$$V_{I2}=V_{ISC}-(V_{IN2}-V_{REF2}) \qquad (53)$$

We define differential input and reference voltages $V_{IND}$, $V_{REFD}$, respectively, and common-mode input voltages and common-mode reference voltages $V_{INC}$, and $V_{REFC}$, respectively, as follows.

$$V_{IND} = V_{IN1} - V_{IN2} \qquad (54)$$

$$V_{REFD} = V_{REF1} - V_{REF2} \qquad (55)$$

$$V_{INC} = \frac{V_{IN1} + V_{IN2}}{2} \qquad (56)$$

$$V_{REFC} = \frac{V_{REF1} + V_{REF2}}{2} \qquad (57)$$

The differential input voltage $V_{ID}$ at the input of the dynamic amplifier 60 is;

$$V_{ID} = V_{I1} - V_{I2} = (V_{IN1} - V_{IN2}) - (V_{REF1} - V_{REF2}) = V_{IND} - V_{REFD} \qquad (58)$$

The common-mode input voltage $V_{IC}$ at the differential amplifier input is $$V_{IC} = \frac{V_{I1} + V_{I2}}{2} = \qquad (59)$$

$$V_{ISC} - \frac{V_{IN1} + V_{IN2}}{2} + \frac{V_{REF1} + V_{REF2}}{2} = V_{ISC} - (V_{INC} - V_{REFC})$$

The differential input voltage $V_{ID}$ at the amplifier input in Eqn. (58) is amplified by the amplifier 60 with a gain according to Eqn. (43). Thus, the embodiment in FIG. 6 amplifies the difference between the differential input voltage and the differential reference voltage.

As indicated in Eqn. (59), the amplifier input common-mode voltage $V_{IC}$ is given by the sampling common-mode voltage $V_{ISC}$ plus the difference between the input common-mode voltage and the reference common-mode voltage. The sampling common mode voltage $V_{ISC}$, the input common-mode voltage $V_{INC}$, and the reference common-mode voltage $V_{REFC}$ can be arranged such that the amplifier input common-mode voltage $V_{IC}$ is set at a voltage where the common-mode drain current $I_{DNC}$ of the NMOS transistors MN1 and MN2 match the common-mode drain current $I_{DPC}$ of the PMOS transistors MP1 and MP2. This way, the output common-mode voltage for $V_{O1}$ and $V_{O2}$ is maintained at a constant level during the amplification phase.

In many circuits, the input common-mode voltage $V_{IC}$ and the reference common-mode voltage $V_{REFC}$ are equal. In this case, the common-mode voltage at the amplifier input is equal to the sampling common-mode voltage $V_{ISC}$.

$$V_{IC}=V_{ISC}+(V_{INC}-V_{REFC})=V_{ISC} \qquad (60)$$

Figure 7:
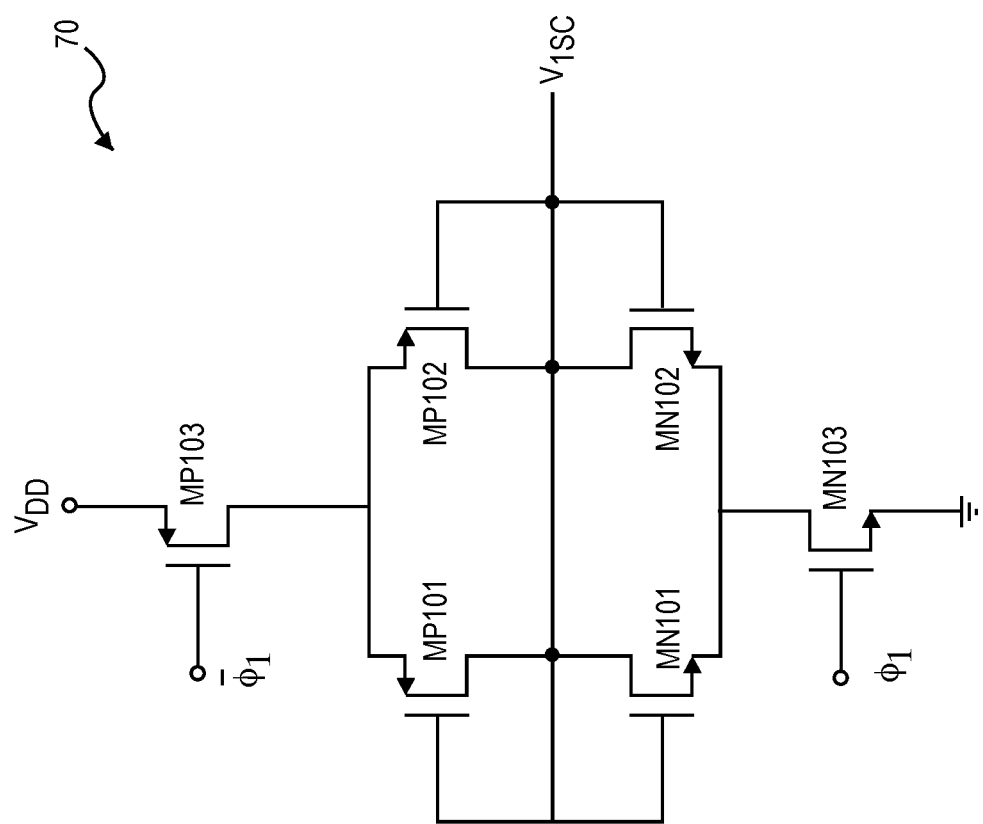
FIG. 7 is a schematic diagram of a sampling common-mode voltage generation circuit according to one or more embodiments of the invention.

Thus, in this case, $V_{ISC}$ should be selected where the common-mode drain current $I_{DNC}$ of the NMOS transistors MN1 and MN2 match the common-mode drain current $I_{DPC}$ of the PMOS transistors MP1 and MP2. An example of such a $V_{ISC}$ generation circuit 70 is shown in FIG. 7. This circuit 70 is a replica of the dynamic amplifier 60 with the input and the output shorted together. The negative feedback from the output back to the input of the dynamic amplifier ensures that both the input voltage and the output voltage settle at a level where the common-mode drain current $I_{DNC}$ of the NMOS transistors MN101 and MN102 match the common-mode drain current $I_{DPC}$ of the PMOS transistors MP101 and MP102, regardless of the power supply voltage $V_{DD}$. In order to reduce the area and power consumption of the $V_{ISC}$ generation circuit 70 in FIG. 7, the device width for MN101-MN103 and MP101-MP103 can be scaled down by a constant factor from the device width of the dynamic amplifier 60 in FIG. 6. To further reduce the power consumption, the power supply and the ground switches MN103 and MP103 may be turned on only during the reset phase.

Figure 8:
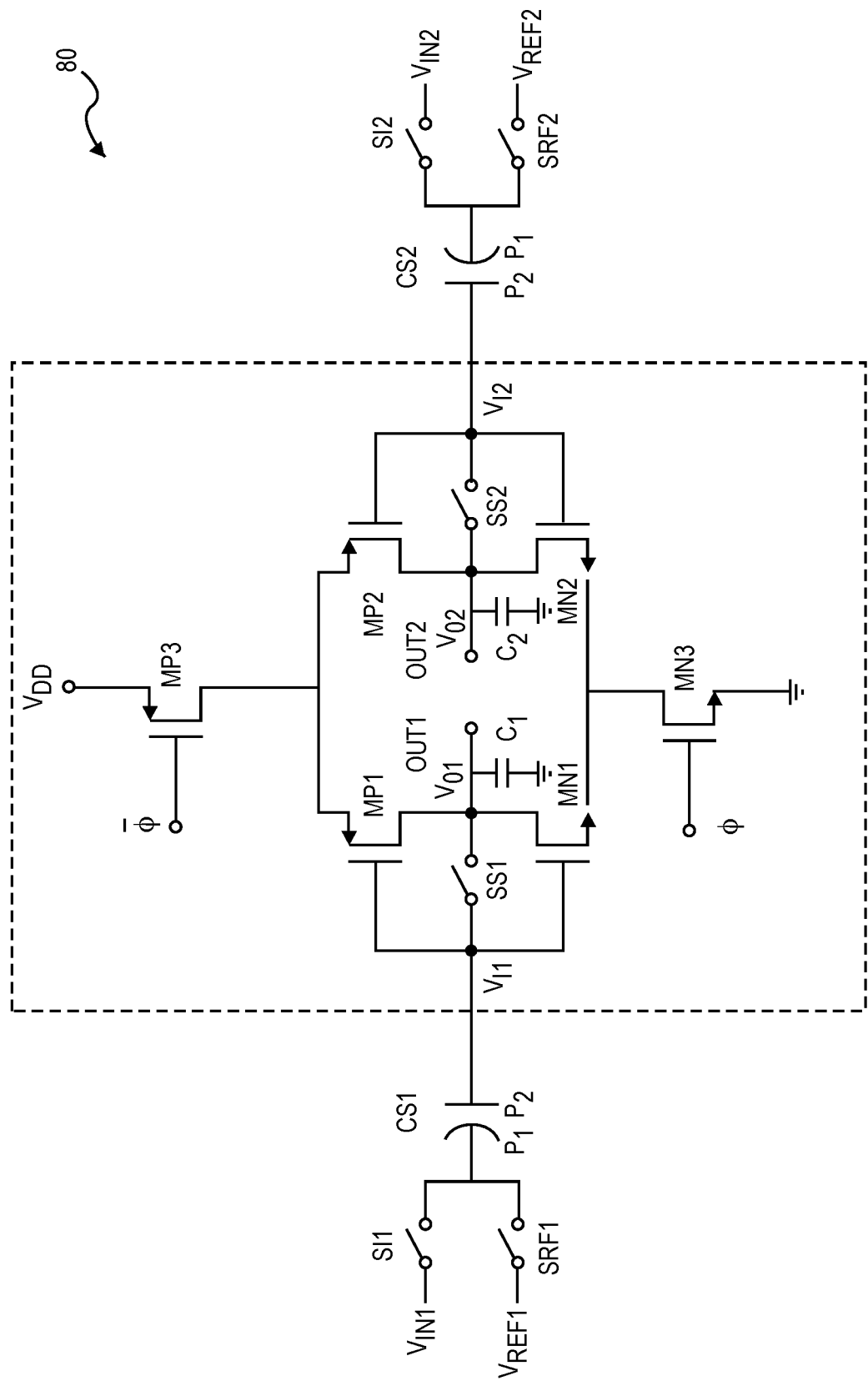
FIG. 8 is a schematic diagram of a push-pull dynamic amplifier circuit according to a third embodiment of the invention.

FIG. 8 illustrates a third embodiment of a push-pull dynamic amplifier 80. This embodiment comprises a push-pull dynamic amplifier 80, and further includes input sampling capacitors CS1 and CS2, each with two plates P1 and P2, reset switches SS1 and SS2, input switches SI1 and SI2, and reference switches SRF1 and SRF2. The amplifier circuit 80 operates in two phases: a reset phase and an amplification phase.

During the reset phase, switches SI1, SI2, SS1 and SS2 are closed. The ground and the power supply switches MN3 and MP3 are also closed. This effects the input voltage $V_{IN1}$ to be applied to the plate P1 of the capacitor CS1, and $V_{IN2}$ to be applied to the plate P1 of the capacitor CS2. A sampling common-mode voltage $V_{ISC}$ is produced by the dynamic amplifier 80, and is applied to the plate P2 of CS1 and CS2. The sampling voltage $V_{ISC}$ produced by the amplifier 80 is the same as that generated by the $V_{ISC}$ generation circuit 70 in FIG. 7, because when the sampling switches SS1 and SS2 are closed, the resulting negative feedback adjusts the input voltages $V_{I1}$ and $V_{I2}$ of the amplifier 80 such that the common-mode drain current of MP1 and MP2 matches the common-mode drain current of MP1 and MP2. At the end of the reset phase, the switches SS1 and SS2 are opened, and then SI1 and SI2 are opened. This locks the voltages across CS1 and CS2 as follows:

$$V_{CS1}=V_{ISC}-V_{IN1}$$

$$V_{CS2}=V_{ISC}-V_{IN2} \quad (61)$$

At the beginning of the amplification phase, the reference switches SRF1 and SRF2 are closed, applying the reference voltages $V_{REF1}$ and $V_{REF2}$ to the plates P1 of CS1 and CS2, respectively. Also, the power supply switches MN3 and MP3 remain closed. As in the embodiment in FIG. 6, the differential input voltage $V_{ID}$ at the input of the dynamic amplifier 80 is;

$$V_{ID}=V_{I1}-V_{I2}=V_{IND}-V_{REFD} \quad (62)$$

Assuming the input common-mode voltage is equal to the reference common-mode voltage:

$$V_{IC}=V_{ISC}-(V_{INC}-V_{REFC})=V_{ISC} \quad (63)$$

Since this common-mode voltage matches the common-mode drain current of MN1 and MN2 to the common-mode drain current of MP1 and MP2, the common-mode output current $I_{OC}$ is equal to zero, and the common-mode output voltage for $V_{O1}$ and $V_{O1}$ stays constant despite the variation of the power supply voltage $V_{DD}$.

At the end of the amplification phase, the power supply switch MP3 and the ground switch MN1 are opened, locking the output voltage $V_{O1}$, $V_{O2}$ on C1 and C2, respectively.

One drawback of the embodiments in FIG. 6 and FIG. 8 is that the currents through transistors are a strong function of the power supply voltage $V_{DD}$. For example, in the circuit 80 in FIG. 8, the gate-to-source voltages of the input transistors MN1, MN2, MP1, and MP2 are a function of the power supply voltage $V_{DD}$; thus their drain currents are a strong function of $V_{DD}$.

Figure 9:
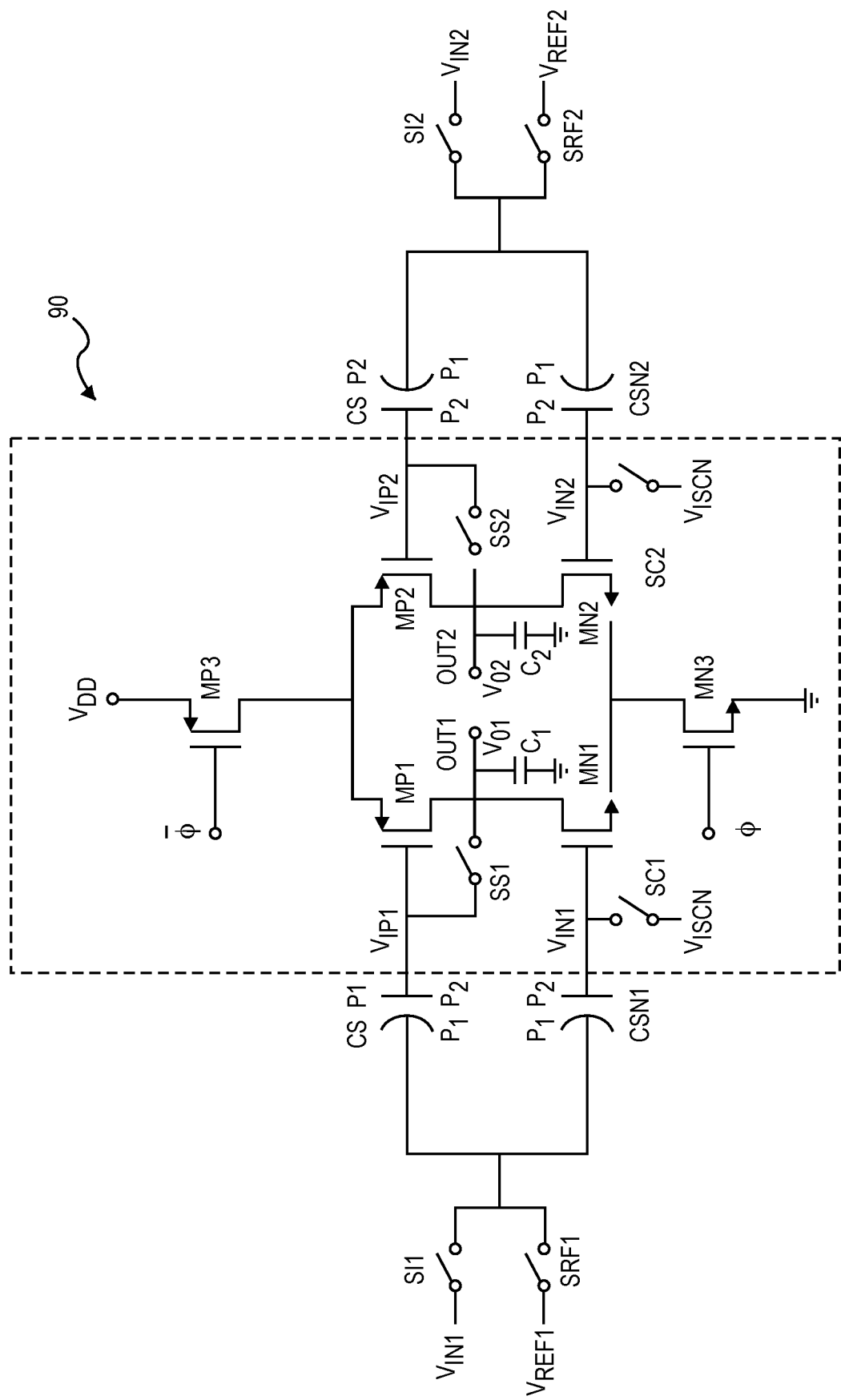
FIG. 9 is a schematic diagram of a push-pull dynamic amplifier circuit according to a fourth embodiment of the invention.

FIG. 9 is a schematic diagram of a push-pull dynamic amplifier 90 according to a fourth embodiment that mitigates this issue. Amplifier 90 comprises NMOS input transistors MN1 and MN2, an NMOS ground switch MN3, PMOS input transistors MP1 and MP2, and a power supply switch MP3. It also includes input switches SI1 and SI2, and reference switches SRF1 and SRF2.

On the PMOS side, amplifier 90 further comprises input sampling capacitors CSP1 and CSP2, each with two plates P1 and P2, and reset switches SS1 and SS2. On the NMOS side, amplifier 90 further comprises input sampling capacitors CSN1 and CSN2, each with two plates P1 and P2, and common-mode switches SC1 and SC2. Amplifier 90 further includes NMOS input sampling common-mode voltage $V_{ISCN}$.

In this embodiment, the gates of PMOS transistors MP1 and MP2 are separated from the gates of the NMOS transistors MN1 and MN2. This allows setting the common-mode input voltage for the PMOS transistors MP1 and MP2 to be different from that for the NMOS transistors MN1 and MN2.

The amplifier circuit 90 operates in two phases: a reset phase and an amplification phase.

During the reset phase, switches SC1, SC2, SS1, SS2, SI1, and SI2 are closed. The ground and the power supply switches MN3 and MP3 are also closed. This affects the input voltage $V_{IN1}$ to be applied to plate P1 of capacitors CSP1 and CSN1, and $V_{IN2}$ to be applied to plate P1 of capacitors CSP2 and CSN2. The NMOS sampling common-mode voltage $V_{ISCN}$ is applied to plate P2 of capacitors CSN1 and CSN2. The closed feedback switch SS1 effectively shorts the gate and the drain of MP1, and the closed feedback switch SS2 effectively shorts the gate and the drain of MP2. This forces the PMOS input voltages $V_{IP1}$ and $V_{IP2}$ to a PMOS sampling common mode voltage $V_{ISCP}$ such that the drain current of MP1 is matched to that of MN1 and the drain current of MP2 is matched to that of MN2. In other words:

$$V_{IP1}=V_{IP2}=V_{ISCP}$$

This $V_{ISCP}$ is applied to plate P2 of CSP1 and CSP2 during the reset phase. At the end of the reset phase, the switches SS1, SS2, SC1, and SC2 are opened, and then SI1 and SI2 are opened. This locks the voltages across CSP1, CSP2, CSN1, and CSN2 as follows:

$$V_{CSP1}=V_{ISCP}-V_{IN1}$$

$$V_{CSP2}=V_{ISCP}-V_{IN2} \quad (64)$$

$$V_{CSN1}=V_{ISNP}-V_{IN1}$$

$$V_{CSN2}=V_{ISNP}-V_{IN2} \quad (65)$$

For simplicity, we can assume that the input common-mode voltage $V_{IC}$ is equal to the reference common-mode voltage $V_{REFC}$.

At the beginning of the amplification phase, the reference switches SRF1 and SRF2 are closed, applying the reference voltages $V_{REF1}$ to the plate P1 of CSP1 and CSN1, and $V_{REF2}$ to the plate P1 of CSP2 and CSN2. The power supply switches MN3 and MP3 remain closed. This causes the input voltages $V_{IP1}$ and $V_{IP2}$ of the amplifier 90 to change to:

$$V_{IP1}=V_{ISCP}-(V_{IN1}-V_{REF1})$$

$$V_{IP2}=V_{ISCP}-(V_{IN2}-V_{REF2}) \quad (66)$$

Also, the input voltages $V_{IN1}$ and $V_{IN2}$ of the amplifier 90 are changed to:

$$V_{IN1}=V_{ISCN}-(V_{IN1}-V_{REF1})$$

$$V_{IN2}=V_{ISCN}-(V_{IN2}-V_{REF2}) \quad (67)$$

As before, we define differential input and reference voltages $V_{IND}$, $V_{REFD}$, respectively, and common-mode input and reference voltages $V_{INC}$, and $V_{REFC}$, respectively, as follows.

$$V_{IND} = V_{IN1} - V_{IN2} \tag{68}$$

$$V_{REFD} = V_{REF1} - V_{REF2} \tag{69}$$

$$V_{INC} = \frac{V_{IN1} + V_{IN2}}{2} \tag{70}$$

$$V_{REFC} = \frac{V_{REF1} + V_{REF2}}{2} \tag{71}$$

The differential input voltage $V_{IDP}$ at the PMOS input of the dynamic amplifier 90 is:

$$V_{IDP} = V_{IP1} - V_{IP2} = (V_{IN1} - V_{IN2}) - (V_{REF1} - V_{REF2}) = V_{IND} - V_{REFD} \tag{72}$$

The common-mode input voltage $V_{ICP}$ at the PMOS input is $$V_{ICP} = \frac{V_{IP1} + V_{IP2}}{2} = V_{ISCP} + +(V_{INC} - V_{REFC}) = V_{ISCP} \tag{73}$$

where $V_{INC} = V_{REF}$ is assumed.

The differential input voltage $V_{IDN}$ at the NMOS input of the dynamic amplifier 90 is:

$$V_{IDN} = \tag{74}$$
$$V_{IN1} - V_{IN2} = (V_{IN1} - V_{IN2}) - (V_{REF1} - V_{REF2}) = V_{IND} - V_{REFD}$$

The common-mode input voltage $V_{IDN}$ at the NMOS input is:

$$V_{ICN} = \frac{V_{IN1} + V_{IN2}}{2} = V_{ISCN} + (V_{INC} - V_{REFC}) = V_{ISCN} \tag{75}$$

where $V_{INC} = V_{REF}$ is assumed.

Thus, as shown in Eqns. (73) and (75), both the PMOS input common-mode voltage and the NMOS input common-mode voltages are set at desired levels, and the common-mode drain currents of PMOS and NMOS transistors match. This keeps the common-mode output voltage constant over time during the amplification phase.

The currents levels in the amplifier circuit 90 in FIG. 9 is set independent of the power supply voltage $V_{DD}$. The NMOS drain currents are set by the NMOS input common-mode voltage $V_{ICN} = V_{ISCN}$ given by Eqn. (75), which is chosen for a desirable level of the NMOS drain currents. The PMOS drain currents match those of NMOS, because the feedback through closed SS1 and SS2 forces the PMOS input common-mode voltage $V_{ICP} = V_{ISCP}$ to be set so that the drain current of MP1 matches that of MN1, and the drain current of MP2 matches that of MN2. Thus, the currents through the transistors are set by $V_{ISCN}$ independent of $V_{DD}$.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. As a specific example, it may be desired to use PMOS input transistors in the amplifier circuits in any of FIGS. 3, 6, 7, 8, and/or 9 instead of the NMOS input transistors as shown in the exemplary figures. Such "flipped" configurations will be appreciated by those who are skilled in the art. It is, therefore, to be understood that the foregoing embodiments are presented by way of example only and that, within the scope of the appended claims and equivalents thereto, inventive embodiments may be practiced otherwise than as specifically described. Inventive embodiments of the present disclosure are directed to each individual feature, system, article, material, kit, and/or method described herein. In addition, any sensible combination of two or more such features, systems, articles, materials, kits, and/or methods, if such features, systems, articles, materials, kits, and/or methods are not mutually inconsistent, is included within the inventive scope of the present disclosure.

Also, the invention described herein may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A dynamic amplifier operable in a reset phase and an amplification phase, comprising:
   a power supply having a first voltage level;
   a reset voltage source having a second voltage level between a ground level and the first voltage level;
   a first and a second input terminal;
   a first and a second output terminal;
   a first NMOS input transistor electrically coupled to the first input terminal and the first output terminal;
   a second NMOS input transistor electrically coupled to the second input terminal and the second output terminal;
   a first PMOS input transistor electrically coupled to the first input terminal and the first output terminal;
   a second PMOS input transistor electrically coupled to the second input terminal and the second output terminal;
   a first reset switch electrically coupled to the first output terminal and the reset voltage source;

a second reset switch electrically coupled to the second output terminal and the reset voltage source;
a power supply switch electrically coupled to the first and the second PMOS input transistors and to the power supply; and
a ground switch electrically coupled to the first and the second NMOS input transistors;
wherein:
during the reset phase:
the first and the second reset switches are closed, and
the power supply switch and the ground switch are opened, and
during the amplification phase:
the first and the second reset switches are opened, and
the power supply switch and the ground switch are closed.

2. The amplifier of claim 1, wherein:
a first input voltage is electrically coupled to the first input terminal, and
a second input voltage is electrically coupled to the second input terminal.

3. The amplifier of claim 2, wherein:
the power supply switch comprises a PMOS transistor, and
the ground switch comprises an NMOS transistor.

4. The amplifier of claim 3, wherein an average current of the first and the second PMOS transistors is substantially equal to an average current of the first and the second NMOS transistors.

5. The amplifier of claim 3, wherein sizes of the first and the second PMOS input transistors are configured such that an average current of the first and the second PMOS transistors is substantially equal to an average current of the first and the second NMOS transistors.

6. The amplifier of claim 1, wherein the power supply switch and the ground switch are turned off at the end of the amplification phase.

7. The amplifier of claim 1, further comprising:
a first sampling capacitor; and
a first input switch electrically coupled to the first sampling capacitor and a first input voltage.

8. The amplifier of claim 7, further comprising a first sampling switch electrically coupled to the first input terminal.

9. The amplifier of claim 8, further comprising a first reference switch electrically coupled to the first sampling capacitor.

10. The amplifier of claim 9, wherein the first input switch is closed during the reset phase and opened during the amplification phase.

11. The amplifier of claim 10, wherein the first reference switch is opened during the reset phase and closed during the amplification phase.

12. The amplifier of claim 9, wherein the first reference switch is electrically coupled to a first reference voltage.

13. The amplifier of claim 7, further comprising:
a second sampling capacitor; and
a second input switch electrically coupled to the second sampling capacitor and a second input voltage.

14. The amplifier of claim 13, further comprising:
a first sampling switch electrically coupled to the first input terminal; and
a second sampling switch electrically coupled to the second input terminal.

15. The amplifier of claim 14, further comprising:
a first reference switch electrically coupled to the first sampling capacitor; and
a second reference switch electrically coupled to the second sampling capacitor.

16. The amplifier of claim 15, wherein the first and the second input switches are closed during the reset phase and opened during the amplification phase.

17. The amplifier of claim 16, wherein the first and the second reference switches are opened during the reset phase and closed during the amplification phase.

18. The amplifier of claim 15, wherein:
the first reference switch is electrically coupled to a first reference voltage, and
the second reference switch is electrically coupled to a second reference voltage.

19. The amplifier of claim 7, wherein:
the first reset switch is electrically coupled to the first input terminal, and
the second reset switch is electrically coupled to the second input terminal.

20. A dynamic amplifier operable in a reset phase and an amplification phase, comprising:
a power supply having a first voltage level;
a reset voltage source having a second voltage level between a ground level and the first voltage level;
a first, a second, a third, and a fourth input terminal;
a first and a second output terminal;
a first input transistor electrically coupled to the first input terminal and the first output terminal;
a second input transistor electrically coupled to the second input terminal and the second output terminal;
a third input transistor electrically coupled to the third input terminal and the first output terminal;
a fourth input transistor electrically coupled to the fourth input terminal and the second output terminal;
a first reset switch electrically coupled to the first output terminal and the reset voltage source;
a second reset switch electrically coupled to the second output terminal and the reset voltage source;
a power supply switch electrically coupled to the third and fourth input transistors and to the power supply; and
a ground switch electrically coupled to the first and the second input transistors;
wherein:
during the reset phase:
the first and the second reset switches are closed, and
the power supply switch and the ground switch are opened, and
during the amplification phase:
the first and the second reset switches are opened, and
the power supply switch and the ground switch are closed.

21. The amplifier of claim 20, further comprising:
a first sampling capacitor electrically coupled to the first input terminal;
a second sampling capacitor electrically coupled to the second input terminal;
a first input switch electrically coupled to the first sampling capacitor and a first input voltage; and
a second input switch electrically coupled to the second sampling capacitor and a second input voltage.

22. The amplifier of claim 21, further comprising:
a third sampling capacitor electrically coupled to the third input terminal;
a fourth sampling capacitor electrically coupled to the fourth input terminal;

a third input switch electrically coupled to the third sampling capacitor and the first input voltage; and
a fourth input switch electrically coupled to the fourth sampling capacitor and the second input voltage.

23. The amplifier of claim 22 wherein:
the first reset switch is electrically coupled to the third input terminal, and
the second reset switch is electrically coupled to the fourth input terminal.

24. The amplifier of claim 22, wherein:
the first reset switch is electrically coupled to the first input terminal, and
the second reset switch is electrically coupled to the second input terminal.

25. A dynamic amplifier operable in a reset phase and an amplification phase, comprising:
a first and a second input terminal;
a first and a second output terminal;
a first NMOS input transistor electrically coupled to the first input terminal and the first output terminal;
a second NMOS input transistor electrically coupled to the second input terminal and the second output terminal;
a first PMOS input transistor electrically coupled to the first input terminal and the first output terminal;
a second PMOS input transistor electrically coupled to the second input terminal and the second output terminal;
a first reset switch electrically coupled to the first output terminal and the first input terminal;
a second reset switch electrically coupled to the second output terminal and the second input terminal;
a power supply switch electrically coupled to the first and the second PMOS input transistors; and
a ground switch electrically coupled to the first and the second NMOS input transistors;
wherein:
during the reset phase:
the first and the second reset switches are closed, and the power supply switch and the ground switch are opened, and
during the amplification phase:
the first and the second reset switches are opened, and
the power supply switch and the ground switch are closed.

26. The amplifier of claim 25, wherein:
a first input voltage is electrically coupled to the first input terminal, and
a second input voltage is electrically coupled to the second input terminal.

27. The amplifier of claim 26, wherein:
the power supply switch comprises a PMOS transistor, and the ground switch comprises an NMOS transistor.

28. The amplifier of claim 27, wherein an average current of the first and the second PMOS transistors is substantially equal to an average current of the first and the second NMOS transistors.

29. The amplifier of claim 27, wherein sizes of the first and the second PMOS input transistors are configured such that an average current of the first and the second PMOS transistors is substantially equal to an average current of the first and the second NMOS transistors.

30. The amplifier of claim 28, wherein the first and the second reset switches are electrically coupled to a reset voltage.

31. The amplifier of claim 25, wherein the power supply switch and the ground switch are turned off at the end of the amplification phase.

32. The amplifier of claim 25, further comprising:
a first sampling capacitor; and
a first input switch electrically coupled to the first sampling capacitor and a first input voltage.

33. The amplifier of claim 32, further comprising a first sampling switch electrically coupled to the first input terminal.

34. The amplifier of claim 33, further comprising a first reference switch electrically coupled to the first sampling capacitor.

35. The amplifier of claim 34, wherein the first input switch is closed during the reset phase and opened during the amplification phase.

36. The amplifier of claim 35, wherein the first reference switch is opened during the reset phase and closed during the amplification phase.

37. The amplifier of claim 34, wherein the first reference switch is electrically coupled to a first reference voltage.

38. The amplifier of claim 32, further comprising:
a second sampling capacitor; and
a second input switch electrically coupled to the second sampling capacitor and a second input voltage.

39. The amplifier of claim 38, further comprising:
a first sampling switch electrically coupled to the first input terminal; and
a second sampling switch electrically coupled to the second input terminal.

40. The amplifier of claim 39, further comprising:
a first reference switch electrically coupled to the first sampling capacitor; and
a second reference switch electrically coupled to the second sampling capacitor.

41. The amplifier of claim 40, wherein the first and the second input switches are closed during the reset phase and opened during the amplification phase.

42. The amplifier of claim 41, wherein the first and the second reference switches are opened during the reset phase and closed during the amplification phase.

43. The amplifier of claim 40, wherein:
the first reference switch is electrically coupled to a first reference voltage, and
the second reference switch is electrically coupled to a second reference voltage.

44. The amplifier of claim 42, wherein:
the first reset switch is electrically coupled to the first input terminal, and
the second reset switch is electrically coupled to the second input terminal.

45. A dynamic amplifier operable in a reset phase and an amplification phase, comprising:
a first, a second, a third, and a fourth input terminal;
a first and a second output terminal;
a first input transistor electrically coupled to the first input terminal and the first output terminal;
a second input transistor electrically coupled to the second input terminal and the second output terminal;
a third input transistor electrically coupled to the third input terminal and the first output terminal;
a fourth input transistor electrically coupled to the fourth input terminal and the second output terminal;
a first reset switch electrically coupled to the first output terminal and the first input terminal;
a second reset switch electrically coupled to the second output terminal and the second input terminal;

a power supply switch electrically coupled to the third and fourth input transistors; and a ground switch electrically coupled to the first and the second input transistors;

wherein:

during the reset phase:
the first and the second reset switches are closed, and
the power supply switch and the ground switch are opened, and during the amplification phase:
the first and the second reset switches are opened, and
the power supply switch and the ground switch are closed.

46. The amplifier of claim 45, further comprising:

a first sampling capacitor electrically coupled to the first input terminal;

a second sampling capacitor electrically coupled to the second input terminal;

a first input switch electrically coupled to the first sampling capacitor and a first input voltage; and a second input switch electrically coupled to the second sampling capacitor and a second input voltage.

47. The amplifier of claim 46, further comprising:

a third sampling capacitor electrically coupled to the third input terminal;

a fourth sampling capacitor electrically coupled to the fourth input terminal;

a third input switch electrically coupled to the third sampling capacitor and the first input voltage; and a fourth input switch electrically coupled to the fourth sampling capacitor and the second input voltage.

* * * * *